(12) United States Patent
Yonemochi et al.

(10) Patent No.: US 6,204,162 B1
(45) Date of Patent: Mar. 20, 2001

(54) PRODUCTION OF SEMICONDUCTOR DEVICE

(75) Inventors: Kazuto Yonemochi; Masahiro Yonemochi, both of Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/427,933

(22) Filed: Oct. 27, 1999

(30) Foreign Application Priority Data

Nov. 5, 1998 (JP) .................................................. 10-314738

(51) Int. Cl.⁷ ..................................................... H01L 21/44
(52) U.S. Cl. ........................... 438/612; 438/106; 438/613
(58) Field of Search ............................................... 438/106

(56) References Cited

U.S. PATENT DOCUMENTS 5,732,465 * 3/1998 Tokita et al. .

FOREIGN PATENT DOCUMENTS 9-162348   6/1997 (JP) .
10-116935  5/1998 (JP) .

* cited by examiner

*Primary Examiner*—Kevin M. Picardat
*Assistant Examiner*—D. M. Collins
(74) *Attorney, Agent, or Firm*—Staas & Halsey LLP

(57) ABSTRACT

A method for producing a semiconductor device, including the steps of: forming a recess on a first side of a metal substrate; forming a film, made of a metal that is not dissolved by an etchant solution which dissolves the metal substrate, on an inner surface of the recess; punch-pressing a region of the metal substrate that corresponds to an area of the metal film from a second side of the metal substrate so that the area of the metal film formed on the inner surface of the recess becomes substantially flush with the first side of the metal substrate, thereby forming a bonding pad from an extending portion of the metal film that extends from the inner surface of the recess over the first side of the metal substrate; mounting the semiconductor chip on said first side; wire-bonding electrodes of the semiconductor chip and the bonding pads; sealing the first side of the metal substrate that includes the semiconductor chip, the bonding wire and the metal film with resin; and dissolving and removing the metal substrate by etching, thereby exposing the metal film formed on the inner surface of the recess.

28 Claims, 12 Drawing Sheets

PRODUCTION OF SEMICONDUCTOR DEVICE

BACKGROUND OF THE INVENTION

1. Field of the Invention

The present invention relates to a method of producing a semiconductor device having resin bumps, that serve as external connection terminals, formed integrally with a resin-sealed portion that seals a semiconductor chip, and a metal substrate applicable to the same.

2. Description of the Related Art

FIG. 1 is a sectional view showing a semiconductor device having external connection terminals formed by means of resin bumps that are formed integrally with a resin-sealed portion. In the drawing, reference numeral 10 denotes a semiconductor chip, 12 denotes a resin-sealed portion and 14 denotes an external connection terminal. The external connection terminals 14 are formed by providing metal films 18 to coat the resin bumps 16 formed to protrude from the bottom face of the resin-sealed portion 12 on the chip mounting face of the semiconductor device. Electrodes of the semiconductor chip 10 and the metal films 18 are electrically connected via bonding wires 20. Reference numeral 22 denotes a resin that protects the back face of the semiconductor chip by preventing the bottom face of the semiconductor chip 10 from being exposed from the resin-sealed portion 12.

FIG. 2 is a bottom view of the semiconductor device. The external connection terminals 14 are arranged at positions that surround the semiconductor chip 10, with the metal film 18 of each of the external connection terminals 14 being electrically connected to the electrode of the semiconductor chip 10 by wire-bonding. When the semiconductor chip 10 and the metal film 18 of the external connection terminals 14 are connected directly with the bonding wire 20, a wiring pattern for electrically connecting the external connection terminals and the bonding wires becomes unnecessary, and it is also unnecessary to secure a space for providing the wiring pattern, thus making it possible to reduce the size of the semiconductor device.

FIG. 3(a) to FIG. 3(e) show the method of producing the semiconductor device described above. First, a photo-resist is applied to the surface of a metal substrate 30 such as copper foil, exposed to light and developed, thereby to form a photo-resist pattern 32 with openings where the external connection terminals 14 are to be formed (FIG. 3(a)). Then the metal substrate 30 is half-etched using the photo-resist pattern 32 as a mask to form a recess 34 (FIG. 3(b)). The inner surface of the recess 34 is then coated with plating of palladium or the like to form a metal film 18 (FIG. 3(c)). Then the semiconductor chip 10 is mounted on the metal substrate 30 via the chip fastening resin 22, and the electrodes of the semiconductor chip 10 and the metal films 18 formed on the bottom faces of the recesses 34 are connected by wire-bonding (FIG. 3(d)).

Then one side of the metal substrate 30 whereon the semiconductor chip 10 is mounted is sealed with a resin by a resin sealing apparatus. FIG. 3(e) shows the condition of the semiconductor chip 10 sealed with the resin. The semiconductor device is obtained by dissolving and removing the metal substrate 30 by etching the semiconductor chip 10 sealed with the resin. There is another method of producing the semiconductor device in which the metal films 18, the resin-sealed portion 12 and the like are formed in such a way as can be exfoliated from the metal substrate 30, and the resin-sealed portion 12 is exfoliated from the metal substrate 30 thereby separating them after sealing with the resin.

The semiconductor device described above is characterized by the fact that the semiconductor device can be provided as a small size product. However, because the resin bump 16 is formed integrally with the resin-sealed portion 12 when sealed with the resin, it is necessary to form the recess 34 in the metal substrate 30. Also because the bottom face of the recess 34 serves as a bonding pad, an area necessary for bonding must be secured on the bottom face of the recess 34, thus making it impossible to arrange the external connection terminals 14 in a high density.

FIG. 4(a) and FIG. 4(b) are enlarged views of the arrangement of the connections between the external connection terminals 14 and the mounting substrate. In the semiconductor device of the prior art, a bonding pad for connecting the external connection terminals 14 to the mounting substrate is a rectangle measuring about 0.6×0.3 mm, with intervals of about 0.65 mm between terminals. The bonding pad for connecting the external connection terminal 14 has a rectangular shape because a certain amount of area is required for the bonding pad and because the bottom face of the recess 34 is required to have a certain amount of area in order to prevent a bonding tool or the bonding wire 20 from making contact with an edge of the recess 34 when the bonding tool advances toward the bottom face of the recess 34. The recess 34 is also required to have a depth of about 0.3 mm in order to ensure the height of the external connection terminals 14.

When a product having a multitude of pins is produced with the semiconductor device having resin bumps 16 that serve as external connection terminals 14 being formed integrally with the resin-sealed portion 12 that seals the semiconductor chip, layout of the external connection terminals 14 is limited in the connecting construction of the prior art, and it is difficult to effectively mount with high density.

SUMMARY OF THE INVENTION

The object of the present invention is to provide a preferable method of producing the semiconductor device having a connection construction which enables it to more effectively make multiple-pin construction, and a metal substrate applicable to the method.

In order to achieve the object, according to the first aspect of the present invention, there is provided a method of producing the semiconductor device, which comprises the steps of:

forming a recess on one side of the metal substrate;

forming a metal film, made of a metal that is not dissolved by an etchant solution which dissolves the metal substrate, on the inner surface of the recess;

punch-pressing a region of the metal substrate, that corresponds to one region of the metal film, from the other side of the metal substrate so that the region of the metal film formed on the bottom face of the recess becomes substantially flush with said one side of the metal substrate, thereby to form a bonding pad from an extending portion of the metal film that extends from the bottom face of the recess over the surface of the metal substrate;

mounting a semiconductor chip on said one side of the metal substrate whereon the bonding pad is formed;

wire-bonding the electrodes of the semiconductor chip and the bonding pads;

sealing with resin said one side of the metal substrate that includes the semiconductor chip, the bonding wire and the metal film; and dissolving and removing the metal substrate by etching, thereby to expose the metal film formed on the inner surface of the recess.

In the first aspect of the present invention, the region where the metal film formed on the bottom face of the recess is punch-pressed is preferably at a position near the portion where the semiconductor chip is mounted in the bottom face of the recess.

In the first aspect of the present invention, it is preferable to provide a photo-resist pattern wherein a portion of the metal substrate where the recess is to be formed is exposed, to form the recess by etching the metal substrate using the photo-resist pattern as a mask, and to form the metal film by plating the inner surface of the recess.

Furthermore, according to the second aspect of the present invention, there is provided a method of producing the semiconductor device, which comprises the steps of:

forming a recess on one side of the metal substrate;

forming a metal film, made of a metal, that is not dissolved by an etchant solution which dissolves the metal substrate, on the inner surface of the recess and on the periphery of mouth of the recess;

mounting a semiconductor chip on said one side of the metal substrate;

wire-bonding the electrodes of the semiconductor chip and the metal films formed on the periphery of the mouth of the recess, using the metal films as the bonding pads;

sealing with resin said one side of the metal substrate that includes the semiconductor chip, the bonding wires and the metal films; and dissolving and removing the metal substrate by etching, thereby to expose the metal films formed on the inner surface of the recess.

In the second aspect of the present invention, the bonding pads are preferably located near the portion where the semiconductor chip is mounted in the periphery of the mouth of the recess.

In the second aspect of the present invention, it is preferable that a photo-resist pattern is provided wherein portions of the metal substrate where the recesses are to be formed are exposed;

the recess is formed by etching the metal substrate using the photo-resist pattern as a mask;

the photo-resist pattern is removed;

a mask pattern for plating is provided on the metal substrate wherein the inner surface of the recess and the periphery of the mouth of the recess are exposed; and the metal film is formed by plating on the metal substrate using the mask pattern thereby to form the metal film on the inner surface of the recess and on the periphery of the mouth of the recess.

According to the third aspect of the present invention, there is provided a metal substrate having a recess on one side thereof, wherein a metal film, made of a metal that is not dissolved by an etchant solution which dissolves the metal substrate, is formed on the metal substrate to extend on the surface of the metal substrate from the bottom of the recess, and the extending portion of the metal film constitutes a bonding pad where an electrode of the semiconductor chip is connected by wire-bonding.

In the first to third aspects of the present invention, it is preferable to form the metal film on the inner surface of the recess by plating palladium, nickel and gold, in this order.

In the first to third aspects of the present invention, the metal substrate preferably consists of a copper foil.

In the first to third aspects of the present invention, it is preferable to form the recess around the chip mounting portion of the metal substrate.

DESCRIPTION OF THE PREFERRED EMBODIMENTS

Preferred embodiments of the present invention will be described in detail below.

First, an embodiment of the method of producing the semiconductor device that includes a step of punch-pressing the metal substrate will be described.

The method of producing the semiconductor device according to this embodiment is basically the same as the method of producing the semiconductor device of the prior art described previously. That is, a semiconductor chip is mounted on one side of the metal substrate, electrodes of the semiconductor chip and bonding pads provided on the metal substrate are connected by wire-bonding, the said one side of the metal substrate whereon the semiconductor chip is mounted is sealed with a resin, then the metal substrate is dissolved and removed by etching, thereby to obtain the semiconductor device.

This embodiment is characterized by the step of forming an external connection terminal forming recess in the metal substrate so that the external connection terminals 14 protrude from the chip mounting surface of the resin-sealed portion 12 of the semiconductor device, and the step of forming the bonding pads at positions near the mouth of the recess where it is easy to carry out wire-bonding of the electrodes of the semiconductor chip for the electrical connection with the external connection terminals 14.

Figure 5:
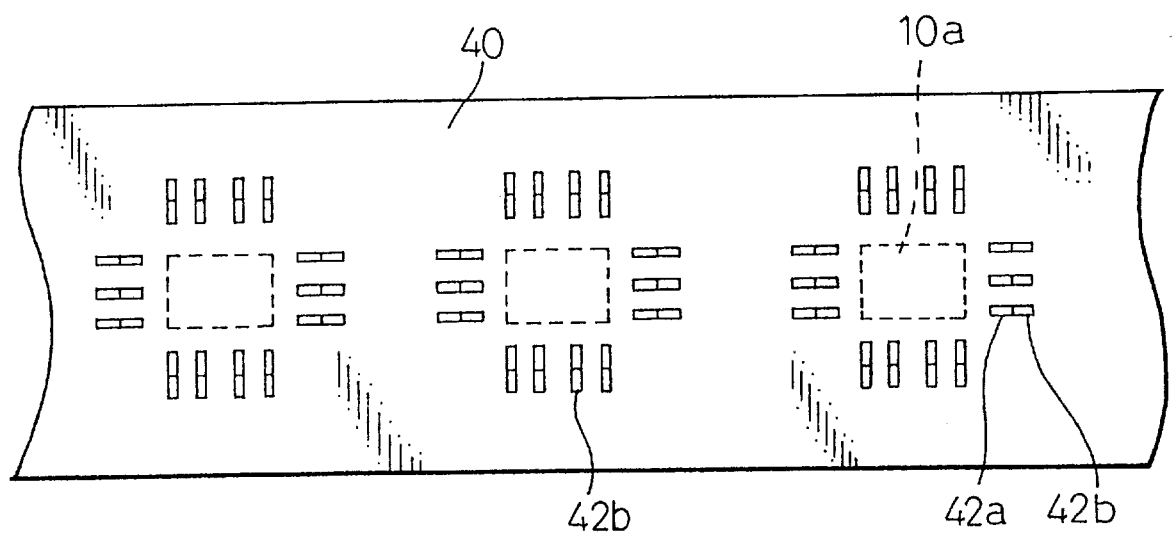
FIG. 5 is a plan view of the metal substrate used in the method of producing the semiconductor device according to the present invention.

FIG. 5 shows bonding pads 42a and external connection terminal forming recesses 42b formed on a metal substrate 40. The metal substrate 40 is a thin sheet of a rectangular or a long strip shape, and chip mounting portions 10a, whereon the semiconductor chips 10 are mounted, are disposed on the metal substrate 40 at predetermined intervals. The bonding pads 42a and the recesses 42b are formed around these chip mounting portions 10a. While a copper foil is used for the metal substrate 40 in this embodiment, the metal substrate 40 may be made of other material that can be easily dissolved and removed by etching.

Figure 1:
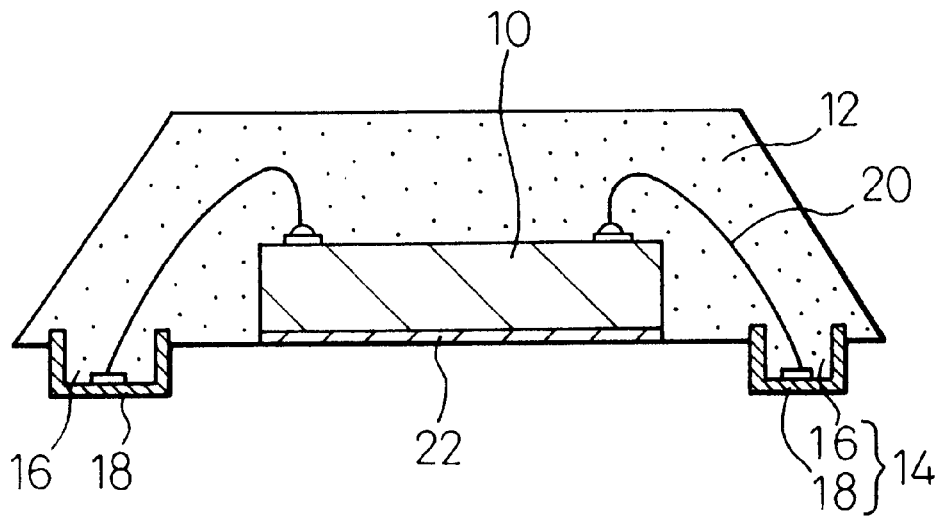
FIG. 1 is a sectional view showing the construction of the semiconductor device having resin bumps.
Figure 2:
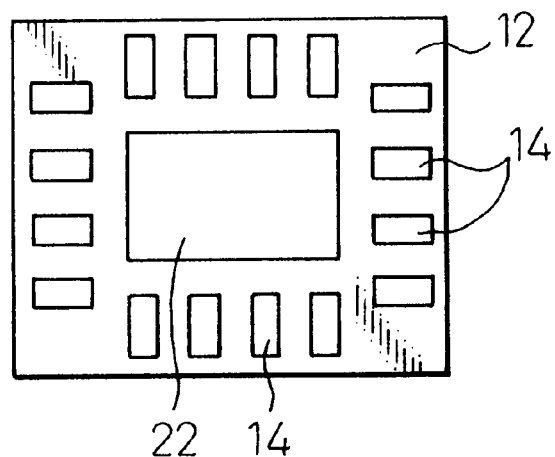
FIG. 2 is a plan view showing a connection plane of the semiconductor device that is connected to a packaging substrate.
Figure 3A:
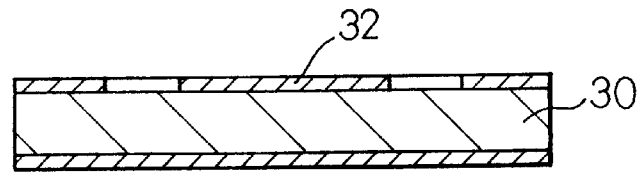
FIG. 3($a$) to FIG. 3($e$) are sectional views showing a method of producing the semiconductor device of the prior art using a metal substrate.
Figure 3B:
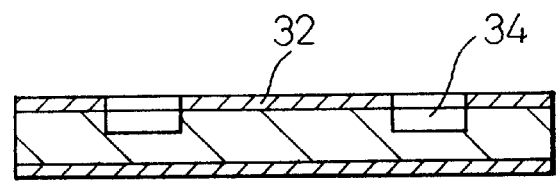
Figure 3C:
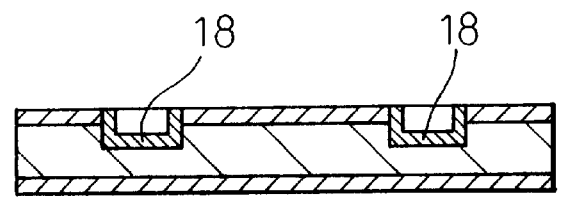
Figure 3D:
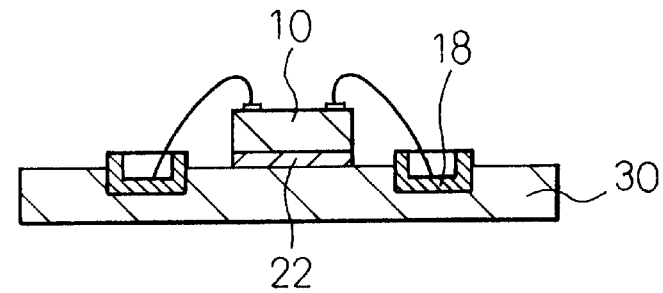
Figure 3E:
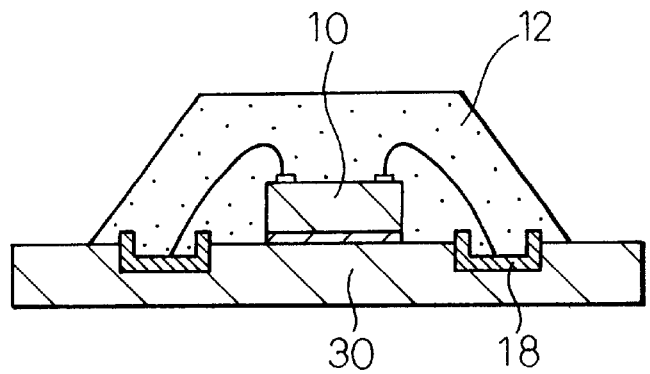
Figure 4A:
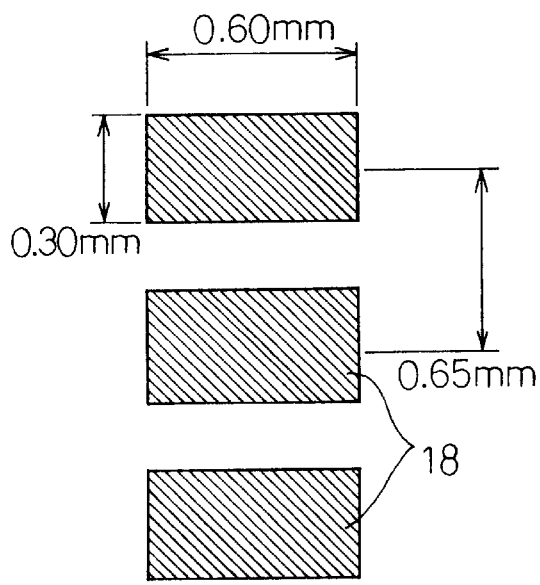
FIG. 4($a$) and FIG. 4($b$) are a plan view and a sectional view, respectively, showing the construction of the bonding pads provided on the metal substrate used in the method of producing the semiconductor device of the prior art.
Figure 4B:
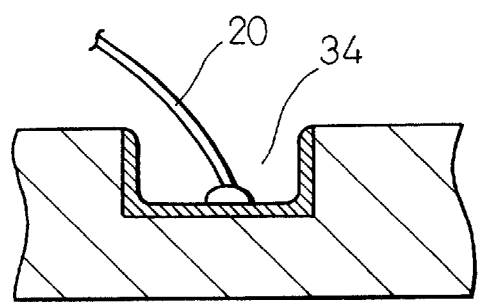
Figure 6A:
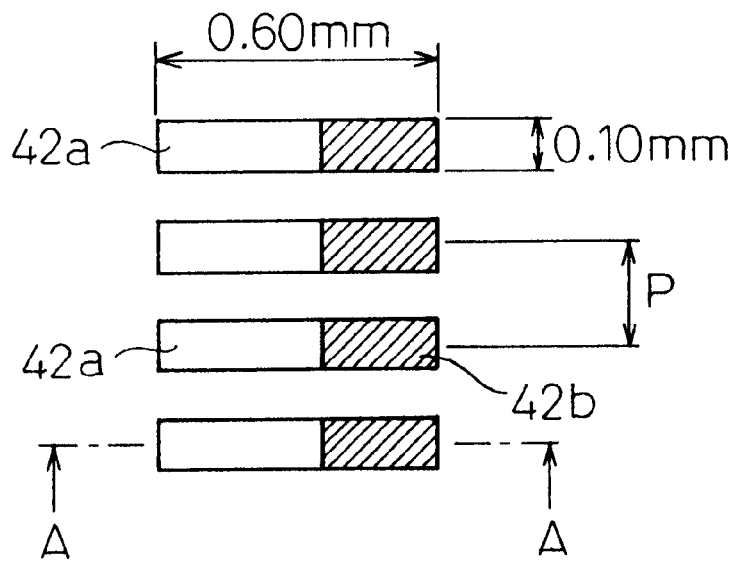
FIG. 6($a$) and FIG. 6($b$) are a plan view and a sectional view, respectively, showing the bonding pads and the recess for external connection formed on the metal substrate.
Figure 6B:
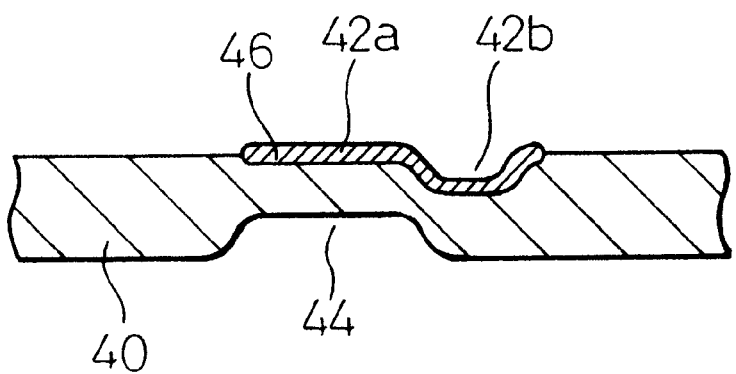

FIG. 6(a) and FIG. 6(b) are enlarged views of the bonding pad 42a and the recess 42b formed on the metal substrate 40. FIG. 6(a) is a plan view of the bonding pad 42a and the recess 42b, and FIG. 6(b) is a sectional view thereof.

The bonding pads 42a are formed by punch-pressing the bottom faces of the recesses that have been formed in advance on the metal substrate 40 from one side of the metal substrate opposite to that where the recesses are formed, so that the surface becomes substantially flush with the other side of the metal substrate 40. The recess has a metal film 46 formed on the inner surface thereof, and the bonding pads 42a are formed by punch-pressing the metal substrate 40 so that the metal film 46 is forced upward.

The recess 42b, that is the remainder of recess that has been formed in advance on the metal substrate 40, has the metal film 46 formed on the inner surface thereof, and electrical connection with the bonding pad 42a is made via the metal film 46. The recess 42b becomes a resin bump 16 when sealed with resin, to be exposed to the outside as an external connection terminal 14.

In this embodiment, as shown in FIG. 6(a), the bonding pads 42a and the recesses 42b are made by forming long rectangles and dividing the rectangle into substantially two halves, one to be the bonding pad 42a and the other to be the recess 42b. Width of the bonding pad 42a and the recess 42b is 0.10 mm, total length of the bonding pad 42a and the recess 42b combined is 0.60 mm and the pitch P is 0.3 mm.

Connections with the mounting substrate formed from the recess 42b of this embodiment are arranged with a far smaller pitch than the connections of the semiconductor device of the prior art, and are consequently arranged at a high density. The connections with the mounting substrate can be arranged in such a high density because there is no need of wire-bonding on the inner bottom face of the recess and it suffices only to carry out wire-bonding on the bonding pad 42a formed on the surface of the metal substrate 40. Thus it is made unnecessary to secure a large bonding area, making it possible to arrange the bonding pads 42a and the recesses 42b in a high density.

Now specific method of forming the bonding pads 42a and the recesses 42b on the metal substrate 40 will be described below with reference to FIG. 7(a) to FIG. 7(f).

Figure 7A:
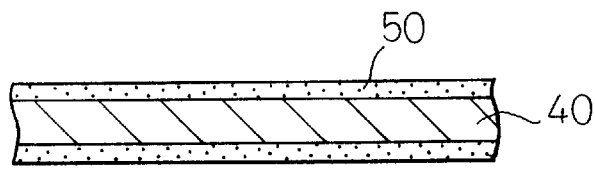
FIG. 7($a$) to FIG. 7($f$) are sectional views showing the steps of forming the bonding pads and the recesses for external connection on the metal substrate.

First, the metal substrate 40, which is a thin metal sheet such as copper foil, is covered with a photo resist 50 applied to both sides thereof (FIG. 7(a)). The metal substrate 40 serves as a supporting body when mounting the semiconductor chip 10 and sealing with resin, and therefore the material and thickness thereof should be chosen to provide the required strength.

Figure 7B:
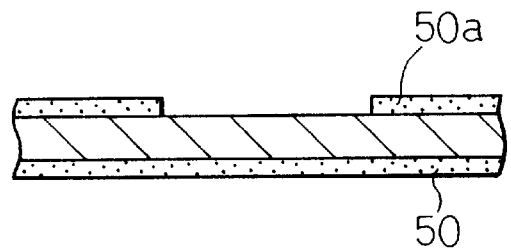
Figure 7C:
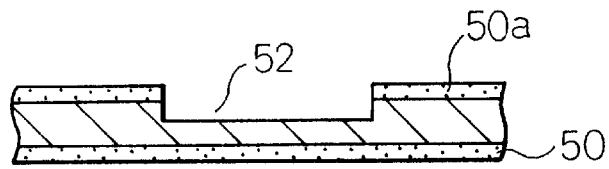

The photo resist 50 on one side of the metal substrate 40 is exposed to radiation and developed to form a photo resist pattern 50a having the portions where the recesses are to be formed being exposed (FIG. 7(b)). As shown in FIG. 5, the bonding pads 42a and the recesses 42b for forming the external connection terminals are formed in plurality in a predetermined arrangement on the metal substrate 40. While a state of only one recess being formed is shown in FIG. 7(b), the photo resist pattern 50a is made in such a construction as the surface of the metal substrate 40 is exposed at the positions where the bonding pad 42a and the external connection terminal forming recess 42b are formed.

Then the metal substrate 40 is etched using the photo resist pattern 50a as the mask, to form recesses 52 (FIG.(c)). Since the recess 52 determines the bump shape of the external connection terminal 14, the recess 52 is formed by controlling the etching step so that the required bump height is obtained.

Then the photo resist pattern 50a is removed, both sides of the metal substrate 40 are covered with plating resist, and the resist is exposed to light and developed to form a mask pattern 54 wherein the recess 52 is exposed.

Figure 7D:
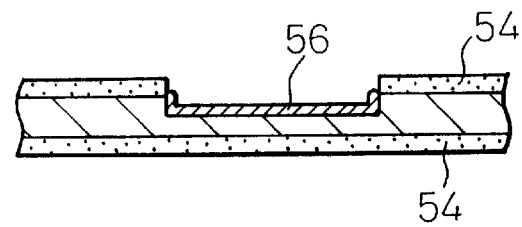

FIG. 7(d) shows the metal substrate 40 masked with the plating mask pattern 54, electroplated using the metal substrate 40 as the power feeding layer, thereby forming the plating film 56 on the inner surface of the recess 52.

The plating film 56 would become the metal film 46 to be formed on the bonding portion 42a and the inner surface of the recess 42b described previously. Since the metal film 46 formed from the plating film 56 makes the bonding pad 42a and the conductor of the external connection terminal 14, it is necessary to select the plating metal by taking into consideration such factors as solderbility for mounting the semiconductor device, and wire-bondability for connecting the semiconductor chip and the bonding pad 42a.

In this embodiment, good solderbility and wire-bondability are ensured by plating palladium, nickel and gold, in this order from the outside of the external connection terminal 14. The plating may be also carried out in the order of nickel, palladium and gold from the outside of the external connection terminal 14.

Also, since the metal substrate 40 is dissolved and removed by etching in a subsequent step, it is necessary to select a material for the plating film 56 that is not eroded by the etchant solution that dissolves the metal substrate 40.

The reason for employing the copper foil for the metal substrate 40 and the multi-layer plating comprising the palladium plating layer, the nickel plating layer and the gold plating layer to form the plating film 56 in this embodiment is to prevent the plating film 56 from being etched by the etchant solution that etches the copper foil.

Figure 7E:
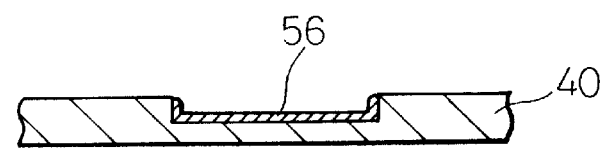
Figure 7F:
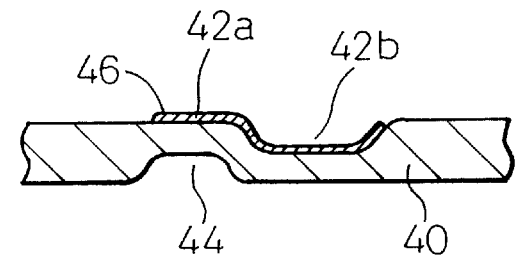

Then the plating mask pattern 54 is removed (FIG. 7(e)) and the metal substrate 40 is punch-pressed in. FIG. 7(f) shows a state in which the bottom face of the recess 52 that has been formed on the metal substrate 40 is punch-pressed from one side of the metal substrate 40 opposite to that where the recess 52 is formed, so that the plating film 56 formed on the bottom surface of the recess 52 becomes substantially flush with the surface of the metal substrate 40.

In this punch-pressing step, one of two divisions of the recess 52 is punch-pressed from below the metal substrate 40, so that the other division of the recess 52 remains as recessed. Reference numeral 44 denotes a punch-pressed recess formed on the bottom of the metal substrate 40 by the punch-pressing step.

By this punch-pressing step, the metal film 46 is formed to extend from the recess 42b over the surface of the metal substrate 40 on one side of the recess 52, so that the metal film 46 of the extending portion and the metal film 46 on the inner surface of the recess 42b continue to each other. The metal film 46 extending over the surface of the metal substrate 40 becomes the bonding pad 42a and the metal film 46 on the inner surface of the recess 42b becomes the conductor that constitutes the external connection terminals 14.

Figure 8A:
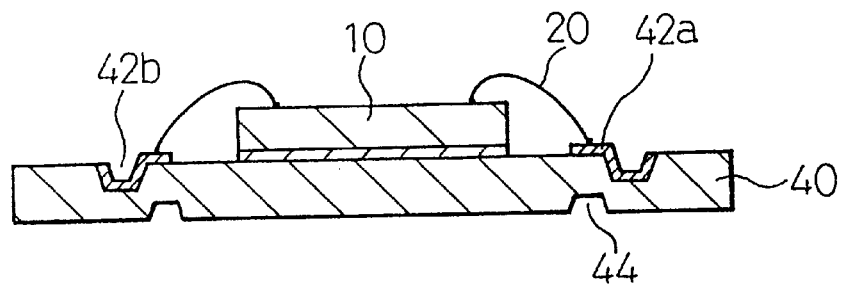
FIG. 8($a$) and FIG. 8($b$) are sectional views showing the steps of mounting the semiconductor chip on the metal substrate and sealing with resin.
Figure 8B:
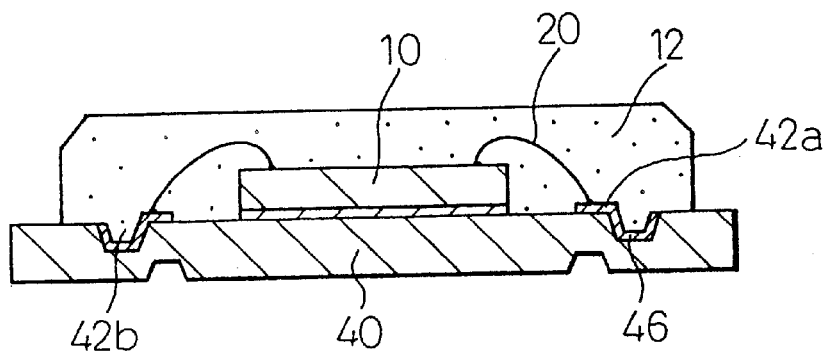

FIG. 8(a) and FIG. 8(b) show a method of producing the semiconductor device using the metal substrate 40 whereon the bonding pads 42a and the recesses 42b are formed as described above.

FIG. 8(a) shows the semiconductor chip 10 mounted in the chip mounting portion 10a of the metal substrate 40 with a chip fastening resin 22, with the electrodes of the semiconductor chip 10 and the bonding pads 42a being connected to each other by bonding gold wires. In this embodiment, since the bonding pads 42a are formed on the surface of the metal substrate 40, wire-bonding of the electrodes of the semiconductor chip 10 and the bonding pads 42a can be done very easily and reliably.

After wire-bonding of the electrodes of the semiconductor chip 10 and the bonding pads 42a, the single side of the metal substrate 40 whereon the semiconductor chip 10 is mounted is sealed with a resin using a resin sealing apparatus (FIG. 8(b)). An area of the metal substrate 40 that covers the mounting region of the semiconductor chip 10, the bonding wire 20 and the metal film 46, is sealed with the resin. In the portion where the recess 42b is formed, the recess 42b is filled with the resin thereby to form a resin bump. Reference numeral 12 denotes the resin-sealed portion.

After sealing with the resin, the metal substrate 40 is dissolved and removed by etching, thereby to obtain the semiconductor device. When etching the metal substrate 40, the resin-sealed portion 12 may be covered with a resin film or the like, in order to protect the resin-sealed portion 12 from being eroded by the etchant.

Figure 9:
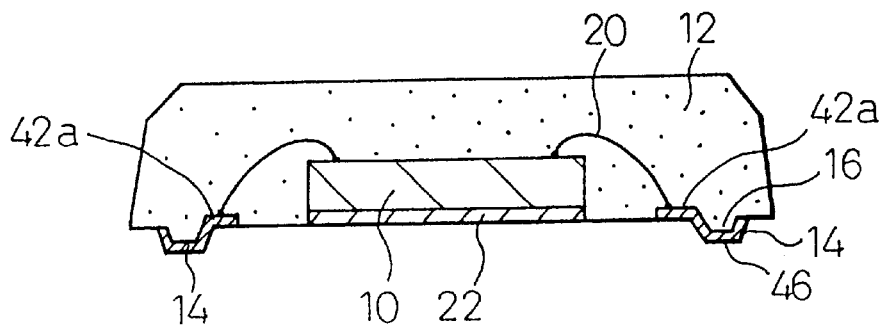
FIG. 9 is a sectional view showing the semiconductor device obtained by dissolving and removing the metal substrate.

Since the metal film 46 is not eroded when etching the metal substrate 40, only the metal substrate 40 is dissolved and removed. As a result, such a semiconductor device, obtained as the metal film 46, is exposed to the outside of the resin bump 16, with the external connection terminals 14 formed thereon as shown in FIG. 9. In this semiconductor device, the portion where the recess 42b is formed becomes the external connection terminal 14 that protrudes like a bump, and the metal film 46 extends from the external connection terminal 14 toward the bonding pad 42a and is exposed to the outside of the resin-sealed portion 12.

FIG. 10(a) to FIG. 10(g) show another embodiment of a method, of producing the semiconductor device, in which the bonding pad 42a and the external connection terminal forming recess 42b are formed on the metal substrate 40. This embodiment is characterized by the use of only etching without punch-pressing the metal substrate 40.

Figure 10A:
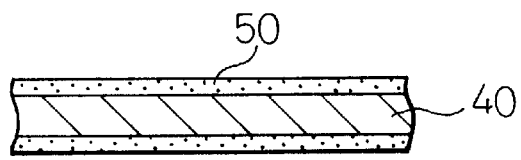
FIG. 10($a$) to FIG. 10($g$) show other steps of forming the bonding pads and the recesses for external connection formed on the metal substrate.

FIG. 10(a) shows the surface of the metal substrate 40 being covered by a photo resist 50 for etching.

Figure 10B:
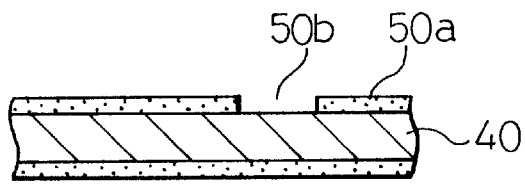

The photo resist 50 is exposed to radiation and developed, thereby to form a photo-resist pattern 50a wherein the metal substrate 40 is exposed at the positions 50b where the external connection terminals 14 are to be formed FIG. 10(b)).

Figure 10C:
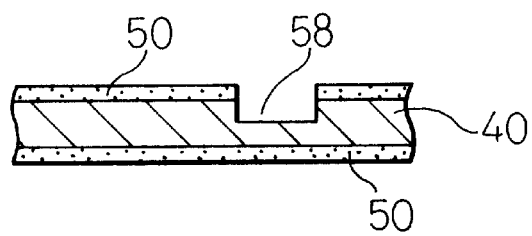

Then the metal substrate 40 is etched using the photo-resist pattern 50a as a mask, to form the recess 58 (FIG. 10(c)). While the recess 52 is formed over an area where the bonding pads 42a and the external connection terminal forming recesses 42b are formed in the method described previously as shown in FIG. 7(c), the recesses 58 in this embodiment are formed only in areas where the external connection terminals 14 are to be formed.

Figure 10D:
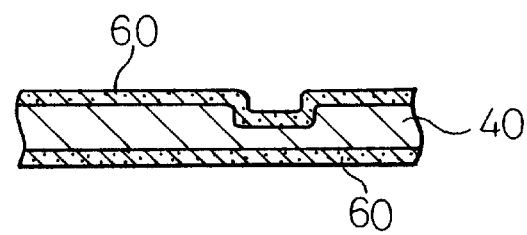
Figure 10E:
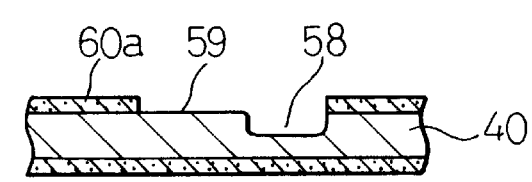

Then the photo resist 50a is removed, the surface of the metal substrate 40 is covered by a photo resist 60 for plating (FIG. 10(d)), and the photo resist 60 is exposed to radiation and developed to form a mask pattern 60a for plating wherein the metal substrate 40 is exposed at the positions where the metal film 46 is to be formed (FIG. 10(e)). The mask pattern 60a causes not only the recess 58 to be exposed but also the periphery of the recess to be exposed in continuity with the recess 58.

Figure 11:
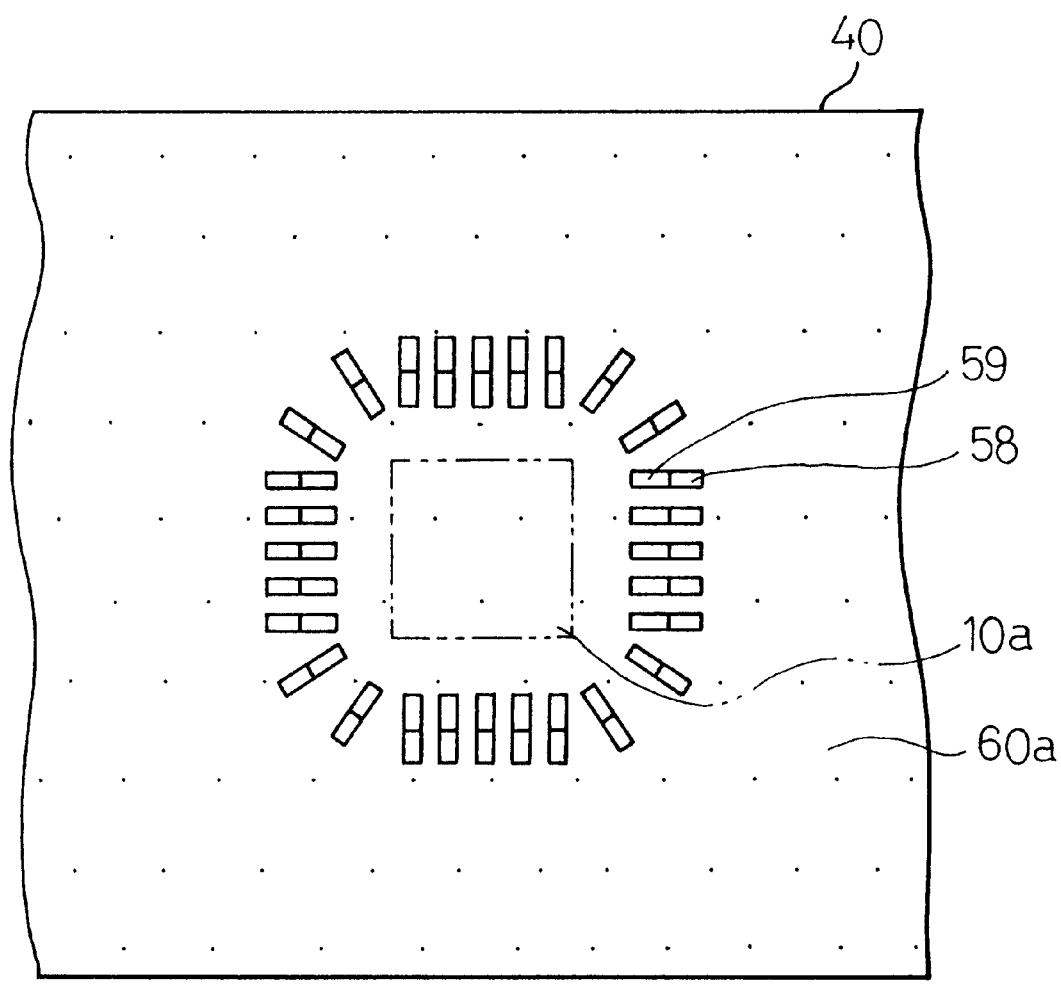
FIG. 11 is a plan view showing the planar arrangement of the recesses formed on the metal substrate and exposed portions FIG. 12($a$) to FIG. 12($d$) are plan views showing another planar arrangement of the recesses formed on the metal substrate and exposed portions.

In this embodiment, the recess 58 is provided to surround the chip mounting portion 10a as shown in FIG. 11, while an exposure portion 59 is provided on one side of the recess 58 where the metal substrate 40 is exposed for forming the bonding pad 42a.

It is possible, of course, to dispose the bonding pads 42a in a desired layout around the periphery of the recess by selecting the proper arrangement of the external connection terminals 14.

Figure 12A:
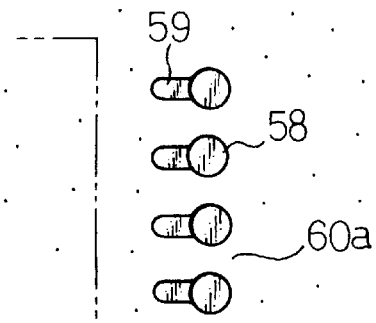
Figure 12C:
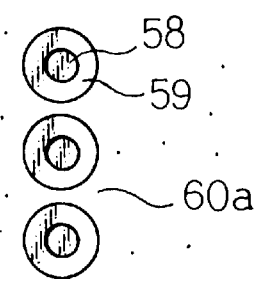
Figure 12B:
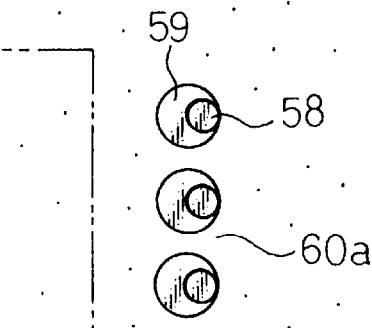
Figure 12D:
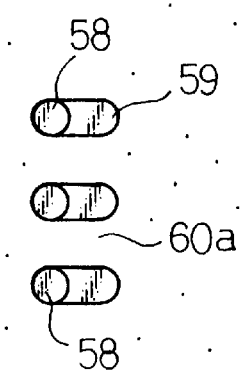

FIG. 12(a) to FIG. 12(d) show examples of the formation of the mask pattern 60a for forming the bonding pads 42a and the recesses 42b. FIG. 12(a) shows an example in which the recess 58 is formed in a circular shape, and the exposure portion 59 is provided for forming the bonding pad 42a on the side nearer to the chip mounting portion 10a. FIG. 12(b) and FIG. 12(c) show examples in which the exposure portion 59 is provided along the periphery of the mouth of the recess 58. FIG. 12(d) shows an example in which the exposure portion 59 is provided on the side of the recess 58 opposite to the chip mounting portion 10a.

Figure 10F:
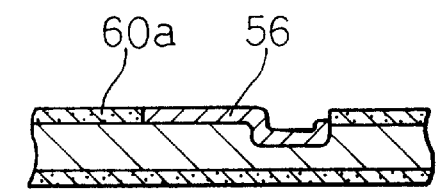

Then electroplating is carried out using the metal substrate 40 as the power feeding layer, thereby to form a plating film 56 in the exposure portions 59 where the inner surface of the recess 58 and the bonding pad 42a are to be formed (FIG. 10(f)).

Figure 10G:
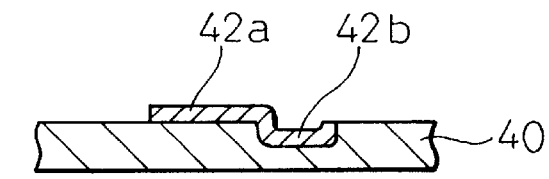

Last, the mask pattern 60a is removed thereby to obtain the metal substrate 40 whereon the plating films 56 are formed at the bonding pad position 42a and on the inner surface of the recess 42b (FIG. 10(g)). The plating films 56 formed at the bonding pad position 42a and on the inner surface of the recess 42b are metal films 46, and are electrically connected to the bonding pads 42a and the inner surfaces of the recesses 42b. It is the same as in the case of the embodiment described previously, that the plating film 56 can be formed from multiple layers. The resultant metal substrate 40 does not have punched-in recess 44 formed on the back face of the metal substrate 40.

The method of producing the semiconductor device by using the metal substrate 40 obtained by the method of this embodiment is exactly the same as that of the method of producing the semiconductor device described previously.

Specifically, the semiconductor chip 10 is mounted on the side of the metal substrate 40 whereon the bonding pads 42a and the recesses 42b are formed, the semiconductor chip 10 and the bonding pads 42a are connected by wire-bonding, an area including the semiconductor chip 10, the bonding wires, the bonding pads 42a and the recesses 42b, is sealed with the resin, and the metal substrate 40 is dissolved and removed by etching, thereby to obtain the semiconductor device.

As the bonding pads 42a become substantially flush with the surface of the metal substrate 40 during wire-bonding, it is made possible to carry out wire-bonding easily as in the same of the embodiments described previously, and to arrange the bonding pads 42a and the recesses 42b in high density.

Preferred embodiments of the method of producing the semiconductor device have been described. But the invention may be applied to other methods than those of these embodiments.

The recesses 52, 58 are formed in the metal substrate 40 by etching the metal substrate 40 in the embodiments described above, although the recesses 52, 58 may also be formed by pressing, instead of etching. In this case, it is not necessary to apply the photo resist 50 to the surface of the metal substrate 40. When pressing is employed in the step, too, the recesses 52, 58 can be formed with significantly high accuracy for the depth and other dimensions.

Figure 13A:
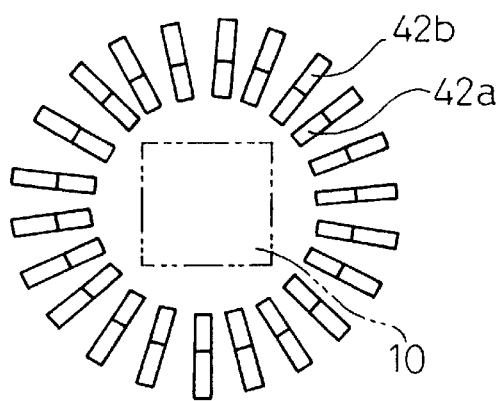
FIG. 13($a$) and FIG. 13($b$) are plan views showing an example of planar arrangement of the bonding pads and the recesses formed on the metal substrate.

The bonding pads 42a and the recesses 42b to be formed on the metal substrate 40 can be arranged in a desired layout appropriate for the product. Although it is common to arrange the bonding pads 42a and the recesses 42b to surround the chip mounting portion 10a to achieve packaging in high density, the bonding pads 42a and the recesses 42b may also be disposed in any arrangement such as in a circle around the chip mounting portion 10a or in a radial construction, as well as along every side of the chip mounting portion 10a. FIG. 13(a) shows an example of arranging the bonding pads 42a and the recesses 42b in a circle.

Figure 13B:
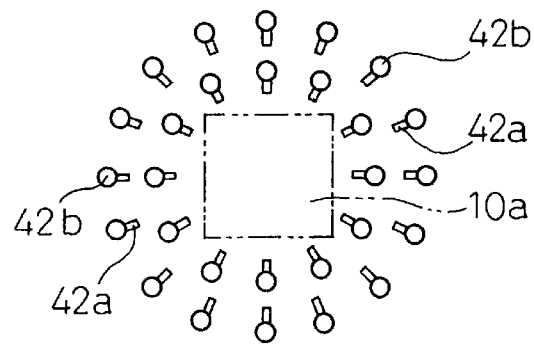

Also the bonding pads 42a are disposed on the side near to the chip mounting portion 10a in order to make the distance between the semiconductor chip 10 and the bonding pad 42a shorter, although the bonding pads 42a may also be disposed at positions more distant from the chip mounting portion 10a. The bonding pads 42a and the recesses 42b may also be disposed in two or more lines in a staggered construction around the chip mounting portion 10a as shown in FIG. 13(b), instead of the single-line arrangement around the chip mounting portion 10a.

Figure 14A:
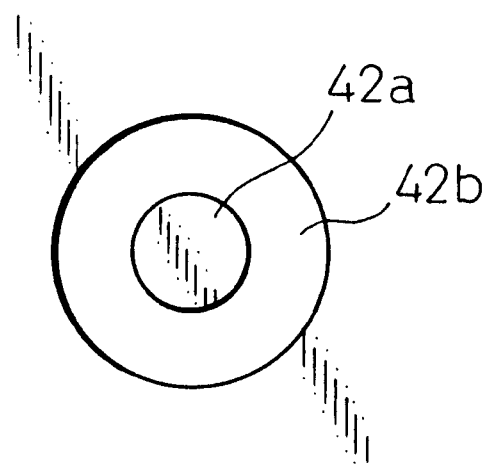
FIG. 14($a$) and FIG. 14($b$) are a plan view and a sectional view, respectively, showing an example of forming the bonding pads and the recesses by a punch-pressing step.
Figure 14B:
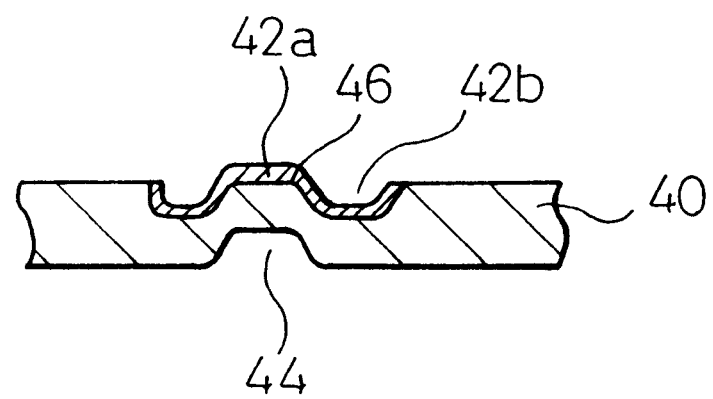

Although the bonding pad 42a is formed by punching in one of two divisions of the recess 52 in the embodiment where punch-in step is employed, it is also possible to form the bonding pads 42a by punching in an intermediate region on the bottom face of the recess 52. FIG. 14(a) and FIG. (b) show an example of forming the bonding pad 42a and the external connection terminal forming recess 42b by punching in the middle portion of the recess 52 that is formed in a circular shape. When punch-in step is employed in this way, the bonding pads 42a can be formed by punching in a portion of the bottom face of the recess 52.

According to the method of producing the semiconductor device of the present invention, as described above, it is possible to easily obtain the semiconductor device having the external connection terminals 14 disposed in a high density and allow for increasing number of pins provided on the semiconductor device, by mounting the semiconductor chip on the metal substrate whereon the bonding pad 42a and the external connection terminal forming recess are formed, connecting the electrodes of the semiconductor chip and the bonding pads by wire-bonding, sealing the semiconductor chip with the resin, and dissolving and removing the metal substrate thereby to produce the semiconductor device. Particularly because the bonding pads are formed substantially flush with the surface of the metal substrate, it becomes unnecessary to carry out wire-bonding on the bottom face of the external connection terminal forming recess, thus making it possible to dispose the bonding pads and the recesses for external connection in a high density. It is also made possible to eliminate complicated steps, thus providing such benefits as products having high reliability can be produced without high production cost.

What is claimed is:

1. A method of producing a semiconductor device, which comprises the steps of:

forming a recess on a first side of a metal substrate;

forming a metal film, made of a metal that is not dissolved by an enchant solution which dissolves the metal substrate, on an inner surface of the recess;

punch-pressing a region of the metal substrate that corresponds to an area of the metal film, from a second side of the metal substrate, so that the area of the metal film formed on the inner surface of the recess becomes substantially flush with said first side of the metal substrate, thereby to form a bonding pad from an extending portion of the metal film that extends from the inner surface of the recess over the first side of the metal substrate;

mounting a semiconductor chip on a portion of said first side of the metal substrate where the bonding pad is formed;

wire-bonding electrodes on the semiconductor chip and the bonding pads together with bonding wires;

sealing with resin said first side of the metal substrate that includes the semiconductor chip, the bonding wires and the metal film; and dissolving and removing the metal substrate by etching thereby to expose the metal film formed on the inner surface of the recess.

2. The method of producing a semiconductor device according to claim 1, wherein the area, wherein the metal film formed on the inner surface of the recess is punch-pressed, is located at a portion of the inner surface of the recess nearer to the portion of the first side where the semiconductor chip is to be mounted.

3. The method of producing a semiconductor device according to claim 1, wherein a resist pattern is formed where the recess is to be formed, and is exposed, wherein the recess is formed by etching the metal substrate using the resist pattern as a mask, and plating the inner surface of the recess, thereby to form the metal film.

4. A method of producing a semiconductor device, which comprises the steps of:

forming a recess on a first side of a metal substrate;

forming a metal film, made of a metal that is not dissolved by an etchant solution which dissolves the metal substrate, on an inner surface and a periphery of the recess;

mounting a semiconductor chip on a portion of said first side of the metal substrate;

wire-bonding electrodes of the semiconductor chip and the metal film formed on the periphery of the recess together with a binding wire, using the metal film as the bonding pad;

sealing with resin said first side of the metal substrate that includes the semiconductor chip, the bonding wire and the metal film; and dissolving and removing the metal substrate by etching, thereby to expose the metal film formed on the inner surface of the recess.

5. The method of producing a semiconductor device according to claim 4, wherein the bonding pad is disposed at a portion of the periphery of the recess nearer to the portion where the semiconductor chip is to be mounted.

6. The method of producing a semiconductor device according to claim 4, which comprises:

forming a resist pattern where the recess is to be formed, and exposing, wherein the recesses are formed by etching the metal substrate using the resist pattern as a mask, removing the resist pattern;

forming a plating mask pattern on the metal substrate such that the inner surface of the recess and the periphery of the recess are exposed; and plating the metal substrate by using the mask pattern, thereby to form the metal film on the inner surface of the recess and on the periphery of the recess.

7. The method of producing a semiconductor device according to claim 1, wherein the metal film is formed on the inner surface of the recess by plating palladium, nickel and gold in this order.

8. The method of producing a semiconductor device according to claim 4, wherein the metal film is formed on the inner surface of the recess by plating palladium, nickel and gold in this order.

9. The method of producing a semiconductor device according to claim 7, wherein the metal substrate comprises a copper foil.

10. The method of producing a semiconductor device according to claim 8, wherein the metal substrate comprises a copper foil.

11. The method of producing a semiconductor device according to claim 1, wherein the recess is formed on a periphery of the portion of the metal substrate where the semiconductor chip is to be mounted.

12. The method of producing a semiconductor device according to claim 2, wherein the recess is formed on a periphery of the portion of the metal substrate where the semiconductor chip is to be mounted.

13. The method of producing a semiconductor device according to claim 3, wherein the recess is formed on a periphery of the portion of the metal substrate where the semiconductor chip is to be mounted.

14. The method of producing a semiconductor device according to claim 4, wherein the recess is formed on a periphery of the portion of the metal substrate where the semiconductor chip is to be mounted.

15. The method of producing a semiconductor device according to claim 5, wherein the recess is formed on a periphery of the portion of the metal substrate where the semiconductor chip is to be mounted.

16. The method of producing a semiconductor device according to claim 6, wherein the recess is formed on a periphery of the portion of the metal substrate where the semiconductor chip is to be mounted.

17. The method of producing a semiconductor device according to claim 7, wherein the recess is formed on a periphery of the portion of the metal substrate where the semiconductor chip is to be mounted.

18. The method of producing a semiconductor device according to claim 8, wherein the recess is formed on a periphery of the portion of the metal substrate where the semiconductor chip is to be mounted.

19. The method of producing a semiconductor device according to claim 9, wherein the recess is formed on a periphery of the portion of the metal substrate where the semiconductor chip is to be mounted.

20. The method of producing a semiconductor device according to claim 10, wherein the recess is formed on a periphery of the portion of the metal substrate where the semiconductor chip is to be mounted.

21. The method of producing a semiconductor device according to claim 1, wherein the metal film is formed on the inner surface of the recess by plating nickel, palladium and gold in this order.

22. The method of producing a semiconductor device according to claim 4, wherein the metal film is formed on the inner surface of the recess by plating nickel, palladium and gold in this order.

23. The method of producing a semiconductor device according to claim 1, wherein the recess is a plurality of recesses, which plurality is formed in a circular array around the portion of the metal substrate where the semiconductor chip is to be mounted.

24. The method of producing a semiconductor device according to claim 4, wherein the recess is a plurality of recesses, which plurality is formed in a circular array around the portion of the metal substrate where the semiconductor chip is to be mounted.

25. The method of producing a semiconductor device according to claim 1, wherein the bonding pad is located closer to the portion of the first side where the semiconductor ship is to be mounted than the recess.

26. The method of producing a semiconductor device according to claim 1, wherein the recess is located closer to the portion of the first side where the semiconductor chip is to be mounted than the bonding pad.

27. The method of providing a semiconductor device according to claim 4, wherein the bonding pad is located closer to the portion of the first side where the semiconductor chip is to be mounted than the recess.

28. The method of producing a semiconductor device according to claim 4, wherein the recess is located closer to the portion of the first side where the semiconductor chip is to be mounted than the bonding pad.

* * * * *

UNITED STATES PATENT AND TRADEMARK OFFICE
CERTIFICATE OF CORRECTION

PATENT NO. : 6,204,162 B1
DATED : March 20, 2001
INVENTOR(S) : Kazuto Yonemochi, et al.

It is certified that error appears in the above-identified patent and that said Letters Patent is hereby corrected as shown below:

<u>Column 10, claim 4,</u>
Line 57, change "binding wire" to -- bonding wire --

Signed and Sealed this

Sixteenth Day of October, 2001

Attest:

NICHOLAS P. GODICI
*Acting Director of the United States Patent and Trademark Office*

*Attesting Officer*